United States Patent
Tsai

(10) Patent No.: US 11,495,627 B2
(45) Date of Patent: Nov. 8, 2022

(54) SINGLE PHOTON AVALANCHE DIODE FABRICATED ON A SILICON-ON-INSULATOR SUBSTRATE

(71) Applicant: UNITED MICROELECTRONICS CORP., Hsin-Chu (TW)

(72) Inventor: Shih-Hung Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 255 days.

(21) Appl. No.: 16/871,017

(22) Filed: May 10, 2020

(65) Prior Publication Data

US 2021/0351211 A1 Nov. 11, 2021

(51) Int. Cl.
H01L 27/146 (2006.01)

(52) U.S. Cl.
CPC .. H01L 27/14605 (2013.01); H01L 27/14621 (2013.01); H01L 27/14627 (2013.01); H01L 27/14645 (2013.01)

(58) Field of Classification Search
CPC ......... H01L 27/14605; H01L 27/14621; H01L 27/14627; H01L 27/14645; H01L 31/107; H01L 31/02327; H01L 27/146; H01L 31/02027; H01L 31/02363; H01L 31/18; H01L 27/14629; G01J 2001/442; G02B 2006/12061; G02B 2006/12123
See application file for complete search history.

(56) References Cited

U.S. PATENT DOCUMENTS

| | | | |
|---|---|---|---|
| 7,160,753 B2 | 1/2007 | Williams, Jr. | |
| 8,101,978 B2 | 1/2012 | Dai | |
| 8,513,587 B2 | 8/2013 | Wang | |
| 9,035,309 B2 | 5/2015 | Park | |
| 9,209,320 B1* | 12/2015 | Webster | H01L 31/02027 |
| 9,653,603 B1 | 5/2017 | Feng | |
| 9,723,233 B2 | 8/2017 | Grauer | |
| 10,056,467 B2 | 8/2018 | Feng | |
| 2007/0246756 A1 | 10/2007 | Mouli | |
| 2016/0126381 A1* | 5/2016 | Wang | H01L 31/035272 257/429 |
| 2017/0186798 A1* | 6/2017 | Yang | H01L 27/14632 |
| 2018/0233521 A1 | 8/2018 | Na | |
| 2019/0019899 A1* | 1/2019 | Wang | H01L 31/02 |
| 2019/0288132 A1* | 9/2019 | Wang | H01L 31/1804 |

FOREIGN PATENT DOCUMENTS

WO WO-2015004867 A1 * 1/2015 ....... H01L 27/14612

* cited by examiner

*Primary Examiner* — Jennifer D Bennett
*Assistant Examiner* — Erin R Garber
(74) *Attorney, Agent, or Firm* — Winston Hsu

(57) ABSTRACT

A single photon avalanche diode includes a silicon-on-insulator (SOI) substrate having a base substrate, a buried oxide layer over the base substrate, and a silicon layer over the buried oxide layer. At least one photodiode region is disposed in the base substrate. The photodiode region comprises an epitaxial layer embedded in the base substrate.

9 Claims, 6 Drawing Sheets

SINGLE PHOTON AVALANCHE DIODE FABRICATED ON A SILICON-ON-INSULATOR SUBSTRATE

BACKGROUND OF THE INVENTION

1. Field of the Invention

The present invention relates to the field of semiconductor technology. More particularly, the present invention relates to a single photon avalanche diode and a fabrication method thereof.

2. Description of the Prior Art

Photodiodes convert light into electrical signals, and form the basis of a wide range of imaging and detection devices. Common configurations of photodiodes include PIN photodiodes, operated in photovoltaic or photoconductive mode, and single photon avalanche diodes (SPADs), typically operated in Geiger mode. Photodiodes can be fabricated using a number of different technologies, but it is particularly convenient and economical to form photodiodes using the CMOS fabrication processes.

Silicon-on-insulator (SOI) substrates are increasingly being used in high performance CMOS integrated circuits. For system on chip (SOC) applications that demand a significant amount of logic circuitry, SOI can offer benefits in power efficiency, low parasitic capacitance, and high switching speeds. In SOI technology, a layer of $SiO_2$, referred to as the buried oxide (BOX), is beneath an active silicon layer, formed either through a high dose oxygen implantation and subsequent annealing (Separation by Implantation of Oxygen, or SIMOX), or by bonding two oxidized silicon wafers together and then etching-back one of those wafers until a thin layer of silicon remains above the oxide layer where the two wafers had been joined.

SUMMARY OF THE INVENTION

One object of the present invention is to provide an improved single photon avalanche diodes (SPAD) with higher fill factor and small size on a silicon-on-insulator (SOI) substrate in order to solve the shortcomings of the prior art.

According to one aspect of the invention, a single photon avalanche diode includes an SOI substrate comprising a base substrate, a buried oxide layer over the base substrate, and a silicon layer over the buried oxide layer; and at least one photodiode region in the base substrate. The photodiode region comprises an epitaxial layer embedded in the base substrate.

According to some embodiments, the epitaxial layer comprises silicon germanium, a group III-V material, silicon carbide, or a combination thereof.

According to some embodiments, the epitaxial layer comprises an $N^+$ silicon epitaxial layer, an intrinsic silicon epitaxial layer on the $N^+$ silicon epitaxial layer, a P doped silicon epitaxial layer on the intrinsic silicon epitaxial layer, an intrinsic germanium epitaxial layer on the P doped silicon epitaxial layer, and a $P^+$ germanium epitaxial layer on the intrinsic germanium epitaxial layer.

According to some embodiments, the epitaxial layer is disposed within a trench in a top surface of the base substrate.

According to some embodiments, the trench has a trench depth of about 2-3 micrometers.

According to some embodiments, the epitaxial layer is in direct contact with the buried oxide layer.

According to some embodiments, the single photon avalanche diode further comprises at least one MOS transistor fabricated on the silicon layer.

According to some embodiments, one terminal of the at least one MOS transistor is electrically connected to the epitaxial layer through a contact that penetrates through the silicon layer and the buried oxide layer.

According to some embodiments, the single photon avalanche diode further comprises an anti-reflection layer disposed on a bottom surface of the base substrate.

According to some embodiments, the single photon avalanche diode further comprises a color filter layer disposed on the anti-reflection layer.

According to some embodiments, the single photon avalanche diode further comprises a microlens layer disposed on color filter layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 to FIG. 11 are schematic, cross-sectional diagrams showing the steps of bonding the first substrate and the second substrate, and the subsequent steps of forming a single photon avalanche diode according to one embodiment of the invention, wherein FIG. 10 illustrates a back-side illumination (BSI) photon detector comprising the single photon avalanche diode according to one embodiment, and FIG. 11 illustrates a BSI image sensor comprising the single photon avalanche diode P according to another embodiment.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Single photon avalanche diodes have been widely studies and successfully implemented for the detection of weak optical signals in the visible and near-infrared signal. Current research efforts are focusing on the increase of pixel performance (high fill factor and photon detection efficiency, PDE). Ge-on-Si device is a potential candidate for high performance application. It has high quantum efficiency and a large frequency bandwidth. Otherwise, small controlled-circuit is the other candidate to improve fill factor.

The present disclosure pertains to a high-performance solid-state photon detector such as a single photon avalanche diode (SPAD) or SPAD sensor with high fill factor, and a method of fabricating same. The present disclosure also involves the use of silicon-on-insulator (SOI) substrate that can be fabricated by Smart Cut process.

Figure 1:
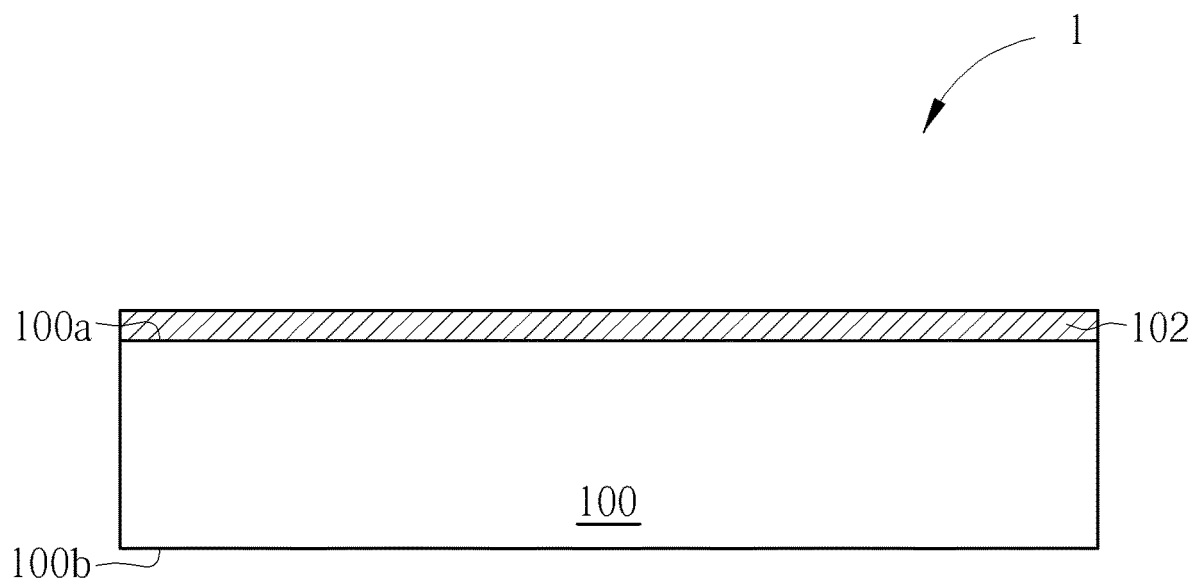
FIG. 1 to FIG. 4 are schematic, cross-sectional diagrams showing a method for fabricating a first substrate comprising photodiode according to one embodiment of the invention.

Please refer to FIG. 1 to FIG. 4. FIG. 1 to FIG. 4 are schematic, cross-sectional diagrams showing a method for fabricating a first substrate (or base substrate) comprising a photodiode region according to one embodiment of the invention. As shown in FIG. 1, a base substrate 1 comprising a crystalline silicon substrate 100 is provided. The crystalline silicon substrate 100 has a front surface 100a and rear surface 100b that is opposite to the front surface 100a. A hard mask layer 102 is deposited onto the front surface 100a. According to one embodiment, the hard mask layer 102 may be a silicon nitride layer, but is not limited thereto.

Figure 2:
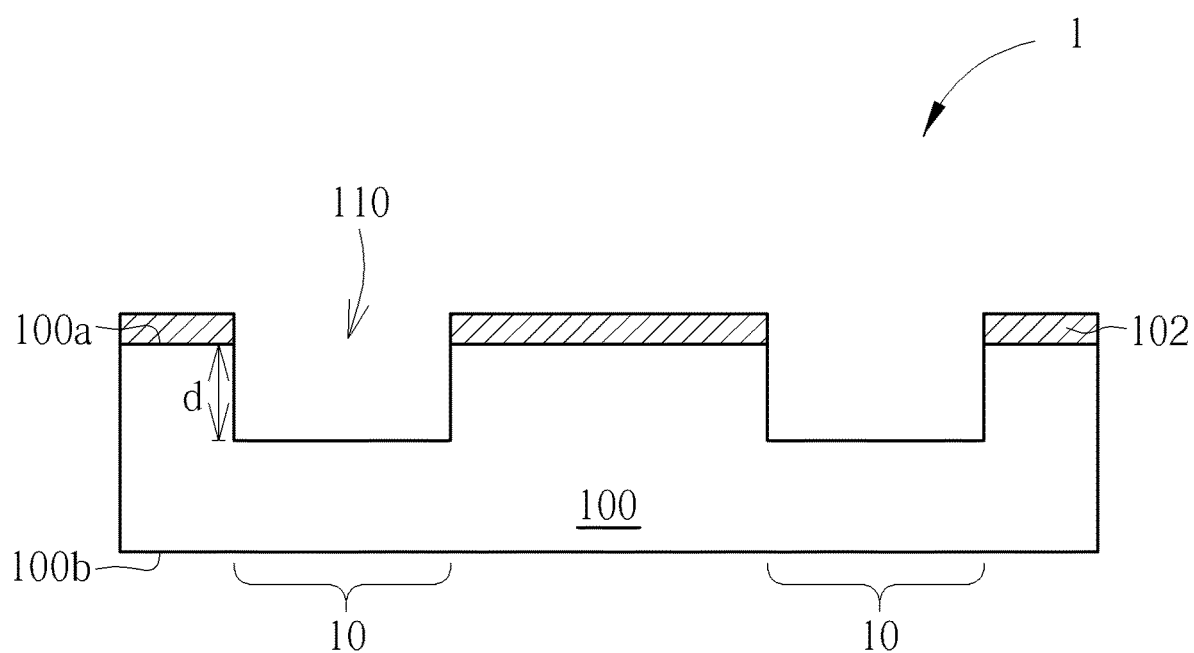

As shown in FIG. 2, subsequently, a photolithographic process and an etching process may be performed to form at least one trench 110 in the hard mask layer 102 and in the front surface 100a of the base substrate 100. For the sake of simplicity, only two exemplary trenches 110 are shown in FIG. 2. According to one embodiment, each of the trenches 110 may has a depth d of about 2~3 micrometers, but is not limited thereto. According to one embodiment, each of the trenches 110 may be commensurate with a photodiode region 10.

Figure 3:
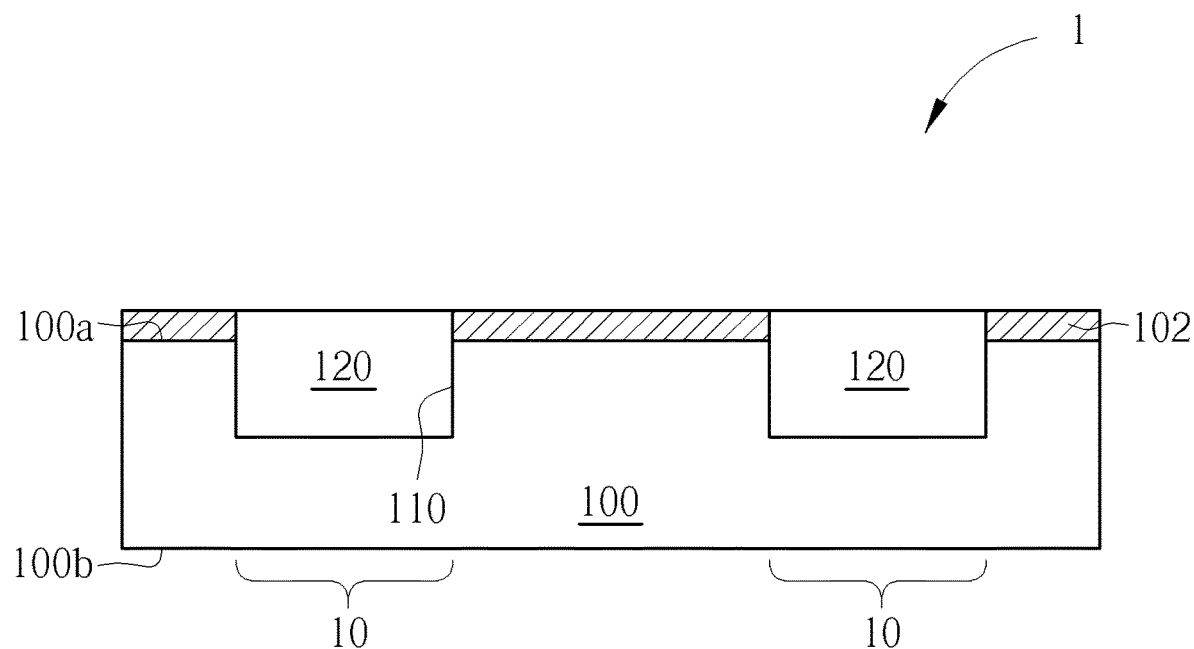

As shown in FIG. 3, subsequently, an epitaxial growth process may be performed to form an epitaxial layer 120 in each of the trenches 110. According to one embodiment, the epitaxial layer 120 may comprise silicon germanium, a group III-V material, silicon carbide, or a combination thereof. According to one embodiment, each of the trenches 110 may be completely filled with the epitaxial layer 120, but is not limited thereto.

Figure 5A:
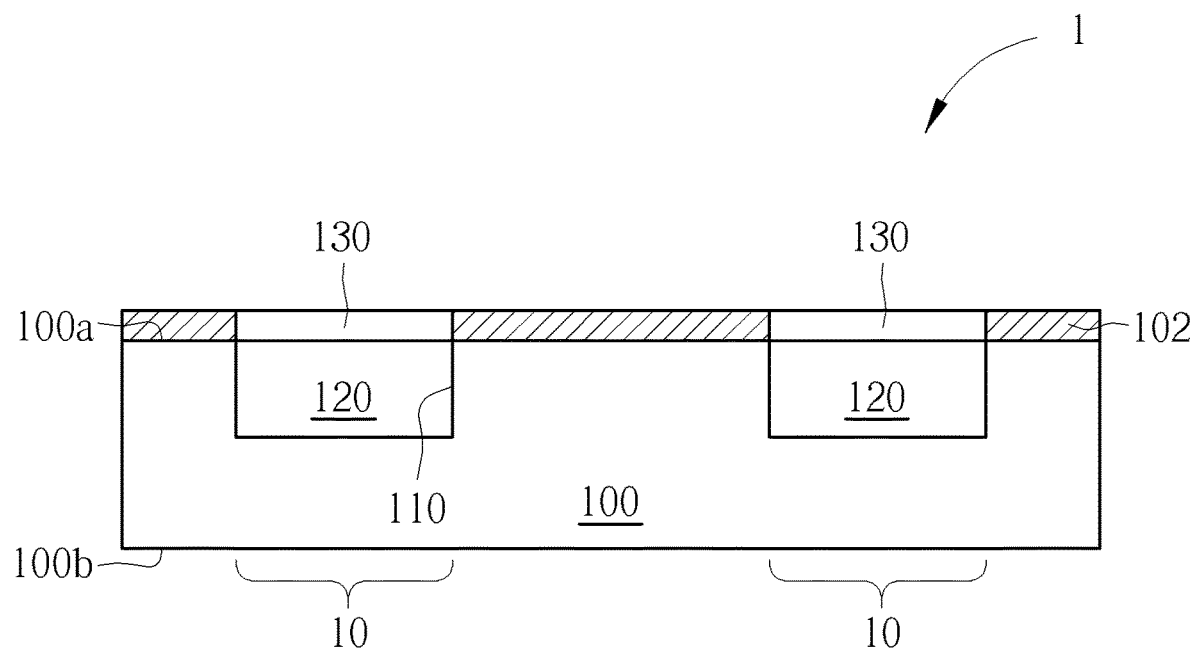
FIG. 5A and FIG. 5B illustrate exemplary epitaxial layer structure according to some embodiments.

Referring also to FIG. 5A, according to some embodiments, a silicon capping layer 130 may be formed on the epitaxial layer 120. The silicon capping layer 130 may function as a sacrificial layer in the subsequent planarization process, but is not limited thereto.

Figure 5B:
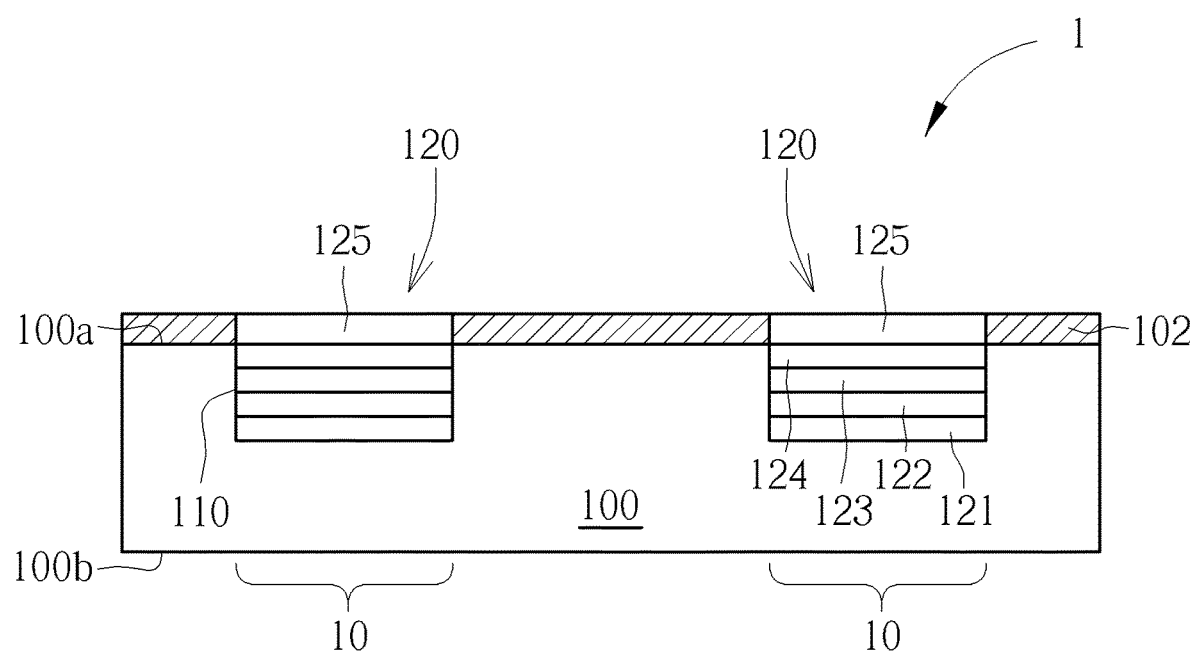

Referring also to FIG. 5B, according to some embodiments, for example, the epitaxial layer 120 may comprises an $N^+$ silicon epitaxial layer 121, an intrinsic silicon epitaxial layer 122 on the $N^+$ silicon epitaxial layer 121, a P doped silicon epitaxial layer 123 on the intrinsic silicon epitaxial layer 122, an intrinsic germanium epitaxial layer 124 on the P doped silicon epitaxial layer 123, and a $P^+$ germanium epitaxial layer 125 on the intrinsic germanium epitaxial layer 124.

Figure 4:
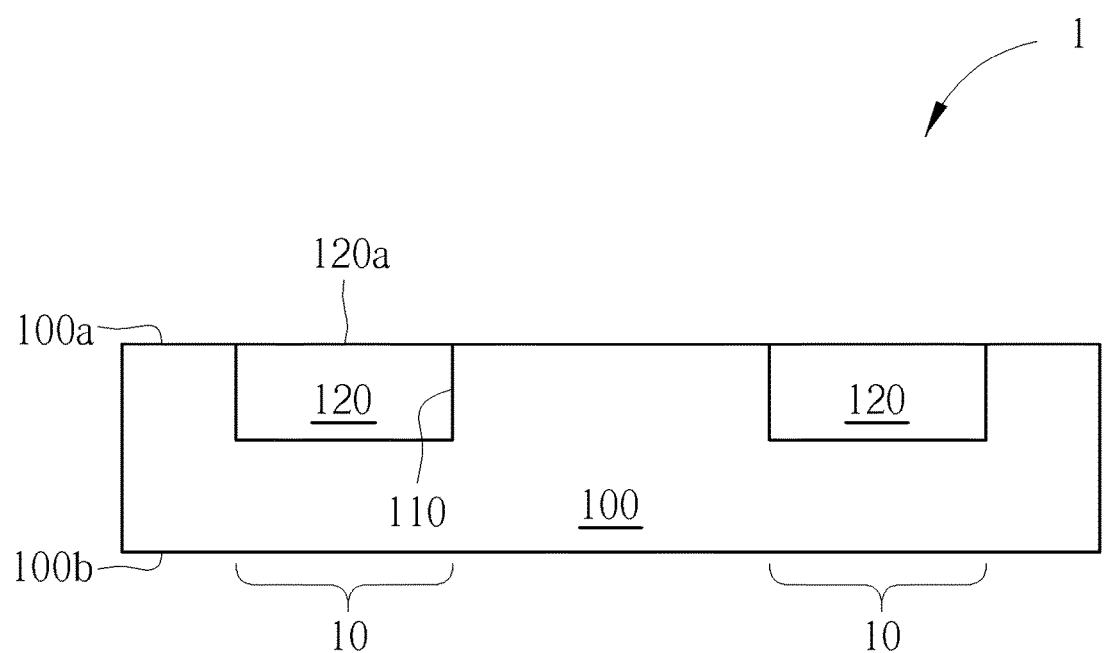

As shown in FIG. 4, after the formation of the epitaxial layer 120 in the crystalline silicon substrate 100, the hard mask layer 102 may be removed. A planarization process such as a chemical mechanical polishing (CMP) process may be performed to planarize the front surface 100a of the crystalline silicon substrate 100. During the CMP process, the silicon capping layer 130 as depicted in FIG. 5A may be completely removed. At this point, the crystalline silicon substrate 100 has a flat front surface 100a. That is, the top surface 120a of the epitaxial layer 120 is flush with the front surface 100a of the crystalline silicon substrate 100.

Figure 6:
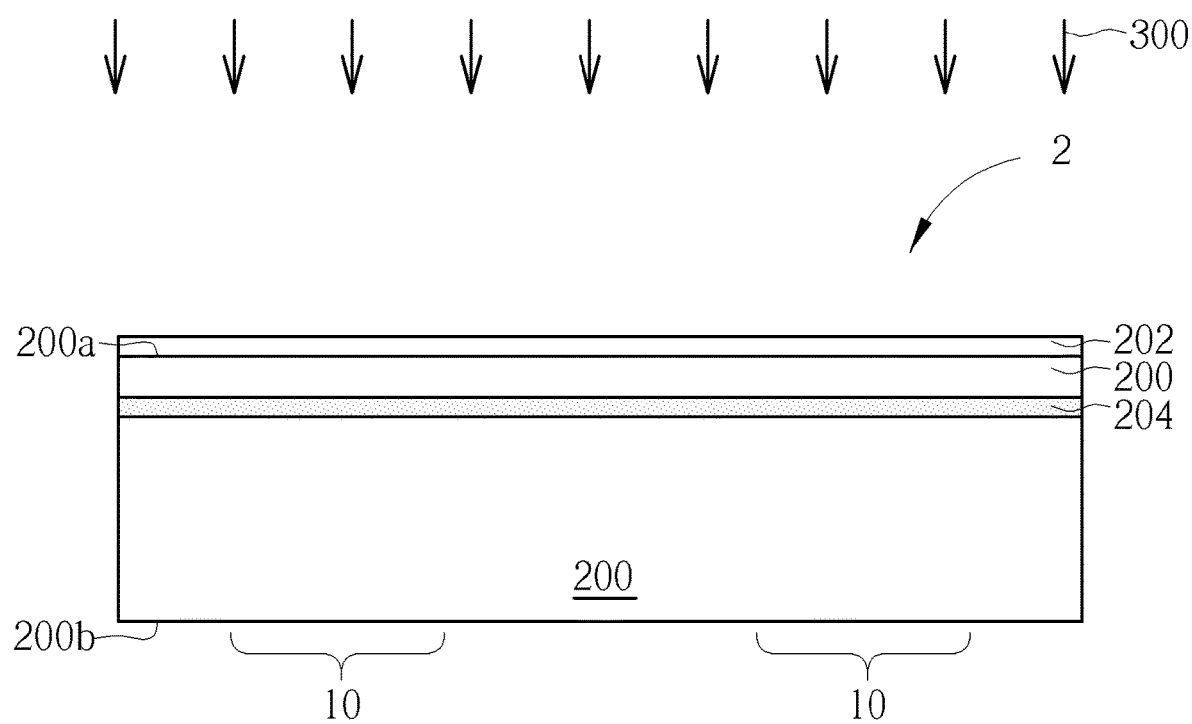
FIG. 6 is a schematic, cross-sectional diagram showing a method for preparing a second substrate according to one embodiment of the invention.

FIG. 6 is a schematic, cross-sectional diagram showing a method for preparing a second substrate (or active substrate) according to one embodiment of the invention. As shown in FIG. 6, an active substrate 2 comprising a crystalline silicon substrate 200 is provided. The crystalline silicon substrate 200 has a front surface 200a and rear surface 200b that is opposite to the front surface 200a.

A silicon oxide layer 202 is formed on the front surface 200a of the crystalline silicon substrate 200. The silicon oxide layer 202 may be formed by placing the crystalline silicon substrate 200 inside an oxidization furnace and then heating it at a predetermined temperature for a predetermined time period. According to one embodiment, the thickness of the silicon oxide layer 202 may be approximately 100~180 nm, but is not limited thereto.

According to one embodiment, an ion implantation process 300 is then performed. Hydrogen ions may be implanted into the front surface 200a so as to form an ion implantation layer 204 in the crystalline silicon substrate 200. Thereafter, the active substrate 2 may be subjected to a cleaving heat process and cleaving can be performed using the ion implantation layer 204 as a boundary.

For example, during the ion implantation process 300, hydrogen ions in a dosage amount of 1.0 E16 atoms/cm$^2$ and at an acceleration voltage of 50 keV are implanted via the silicon oxide layer 202 into the front surface 200a of the crystalline silicon substrate 200. The hydrogen ions are implanted to a position located a predetermined depth from the front surface 200a resulting in the ion implantation layer 204 being formed at a position located at a predetermined depth in the crystalline silicon substrate 200.

Figure 7:
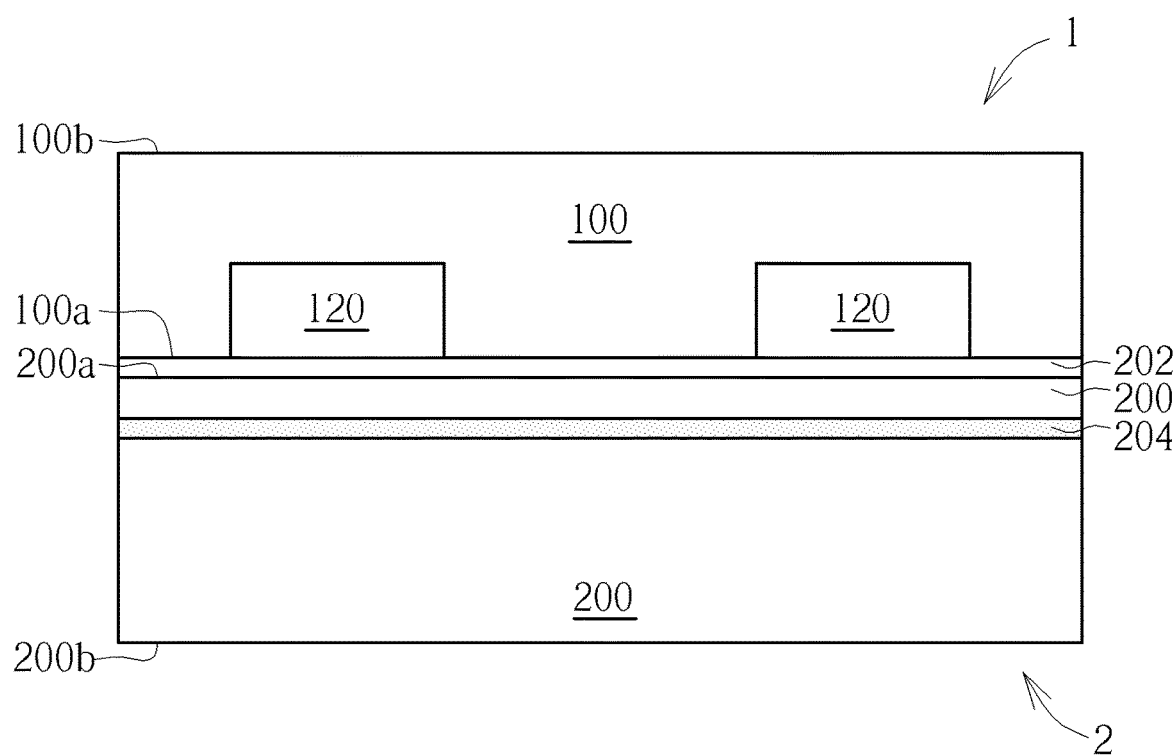

FIG. 7 to FIG. 11 are schematic, cross-sectional diagrams showing the steps of bonding the first substrate with the second substrate, and the subsequent steps of forming a single photon avalanche diode according to one embodiment of the invention. As shown in FIG. 7, the active substrate 2 that has been implanted with hydrogen ions is bonded to the base substrate 1 with the front surface 100a directly facing the front surface 200a of the crystalline silicon substrate 200 of the active substrate 2. As a result, a bonded wafer is formed in which the silicon oxide layer 202 is interposed at the bonding interface.

Figure 8:
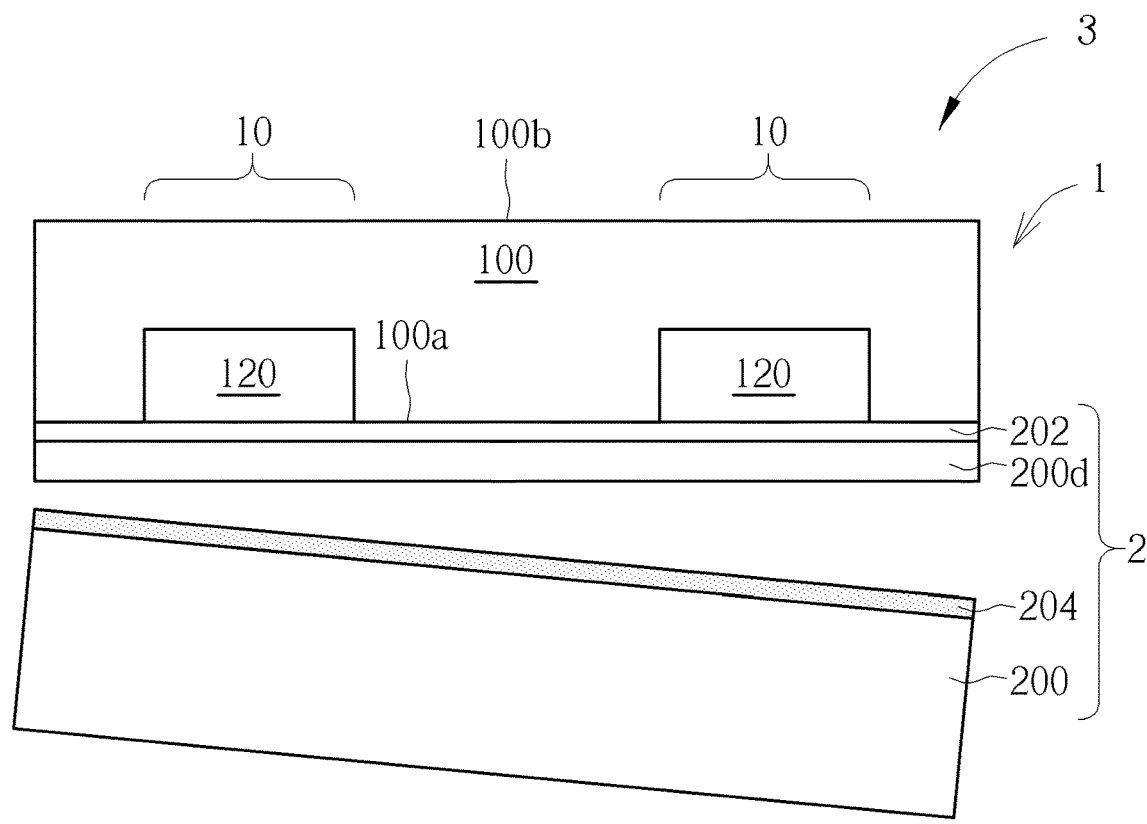

As shown in FIG. 8, the bonded wafer may be subjected to a heat processing in a nitrogen gas atmosphere at approximately 500° C., for example. A hydrogen gas bubble may be formed in the ion implantation layer 204 of the bonded wafer, and a portion of the active substrate 2 is cleaved off with the ion implantation layer 204 where the bubble is formed forming a boundary. Namely, the bonded wafer is separated into an SOI substrate 3 in which an SOI layer (or silicon layer) 200d is stacked via silicon oxide layer (or buried oxide layer) 202 on the base substrate 1, and the remaining active substrate 200. Optionally, a wafer thinning process may be performed.

Figure 9:
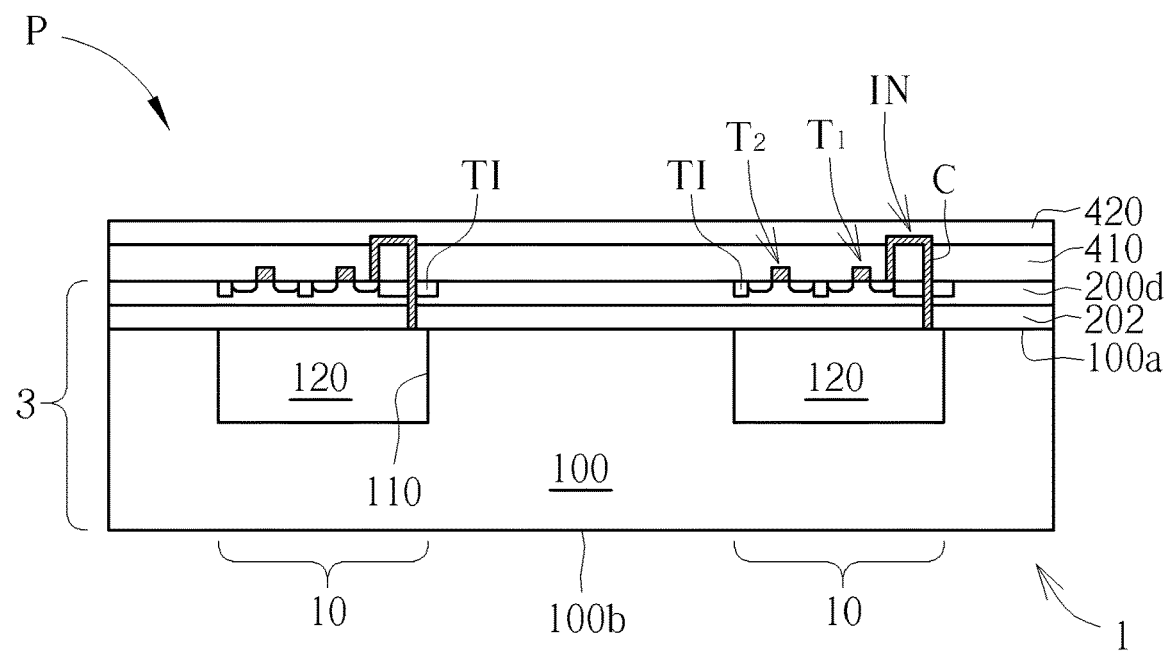

As shown in FIG. 9, a plurality of metal-oxide-semiconductor (MOS) transistors $T_1$ and $T_2$ may be fabricated on the SOI layer 200d. The plurality of MOS transistors $T_1$ and $T_2$ may comprise NMOS or PMOS transistors, which may be isolated from one another by trench isolation TI. According to one embodiment, for example, an interlayer dielectric (ILD) layer 410 and an ILD layer 420 may be deposited on the SOI layer 200d and may cover the plurality of transistors $T_1$ and $T_2$. According to one embodiment, for example, one terminal such as a source or drain region of the transistor $T_1$ may be electrically connected to the epitaxial layer 120 through the interconnect scheme IN and a contact C that penetrates through the silicon layer 200d and the silicon oxide layer 202. A single photon avalanche diode P is completed.

Structurally, as shown in FIG. 9, the single photon avalanche diode P comprises the SOI substrate 3 comprising the base substrate 1, the silicon oxide layer (or buried oxide layer) 202 over the base substrate 1, and a silicon layer 200d over the silicon oxide layer 202; and at least one photodiode region 10 in the base substrate 1. According to one embodiment, the photodiode region 10 comprises an epitaxial layer 120.

According to one embodiment, the epitaxial layer 120 comprises silicon germanium, a group III-V material, silicon carbide, or a combination thereof. According to one embodiment, the epitaxial layer 120 comprises an N$^+$ silicon epitaxial layer 121, an intrinsic silicon epitaxial layer 122 on the N$^+$ silicon epitaxial layer 121, a P doped silicon epitaxial layer 123 on the intrinsic silicon epitaxial layer 122, an intrinsic germanium epitaxial layer 124 on the P doped silicon epitaxial layer 123, and a P$^+$ germanium epitaxial layer 125 on the intrinsic germanium epitaxial layer 124, as shown in FIG. 5B.

According to one embodiment, the epitaxial layer 120 is disposed within a trench 110 in a top surface of the base substrate 1. According to one embodiment, the trench 120 may have a trench depth of about 2-3 micrometers. According to one embodiment, the epitaxial layer 120 is in direct contact with the silicon oxide layer 202.

According to one embodiment, the single photon avalanche diode P further comprises at least one MOS transistor $T_1$ fabricated on the silicon layer 200d. One terminal of the at least one MOS transistor $T_1$ is electrically connected to the epitaxial layer 120 through a contact C that penetrates through the silicon layer 200d and the silicon oxide layer 202.

Figure 10:
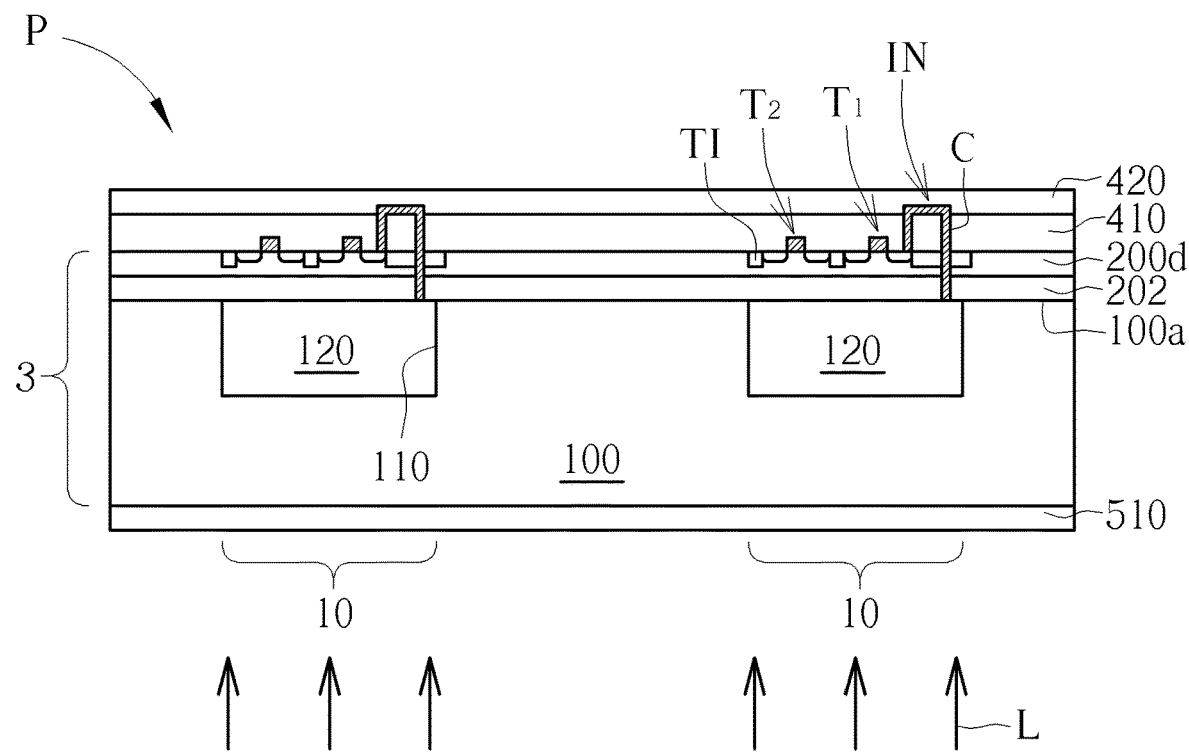

FIG. 10 illustrates a back-side illumination (BSI) photon detector comprising the single photon avalanche diode P according to one embodiment. As shown in FIG. 10, an anti-reflection layer 510 may be disposed on a bottom surface of the base substrate 1 to reduce the reflection of the incident light L.

Figure 11:
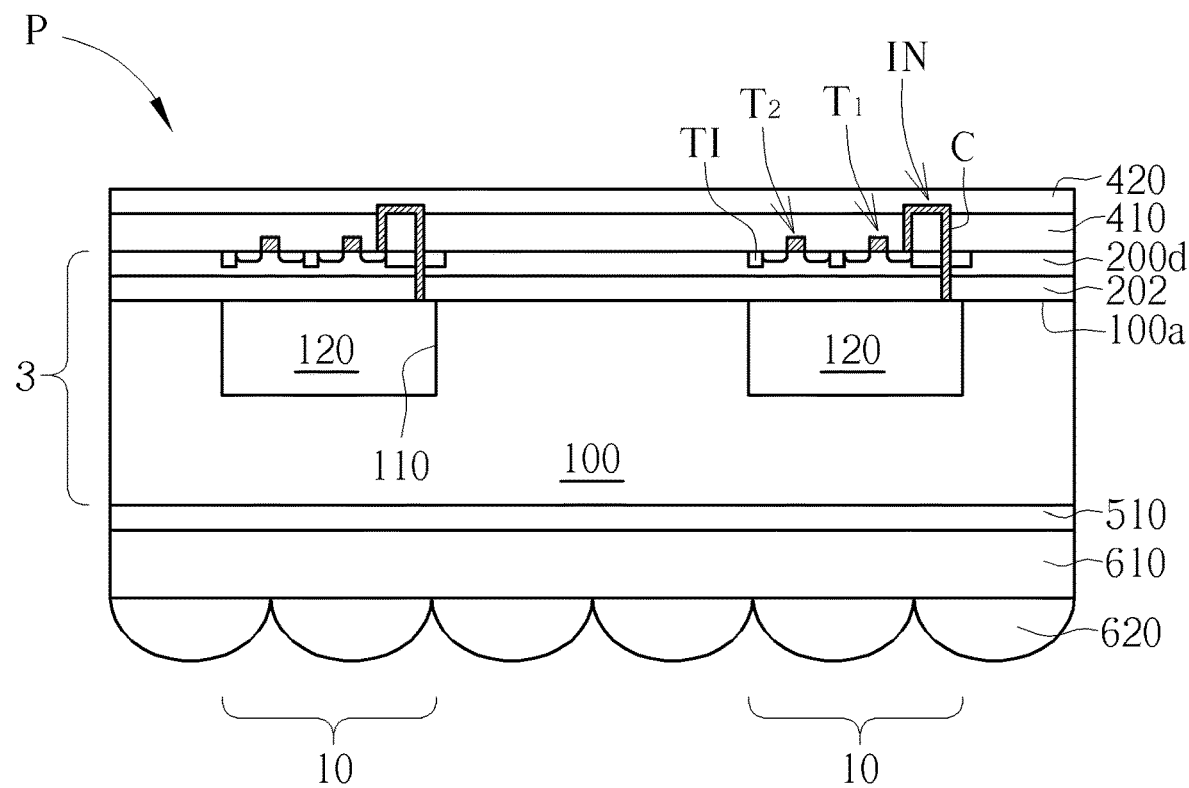

FIG. 11 illustrates a BSI image sensor comprising the single photon avalanche diode P according to another embodiment. As shown in FIG. 11, a color filter layer 610 may be disposed on the anti-reflection layer 510. A microlens layer 620 may be disposed on color filter layer 610.

It is advantageous to use the present invention because the photodiode region 10 comprising the epitaxial layer 120 is embedded in the base substrate 1 of the SOI substrate 3. Therefore, the pixel size can be small while the fill factor is increased. The performance of the single photon avalanche diode P is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single photon avalanche diode, comprising:
    a silicon-on-insulator (SOI) substrate comprising a base substrate, a buried oxide layer over the base substrate, and a silicon layer over the buried oxide layer; and
    at least one photodiode region in the base substrate, wherein the photodiode region comprises an epitaxial layer; and
    at least one MOS transistor fabricated on the silicon layer and isolated by a trench isolation in the silicon layer;
    wherein one terminal of the at least one MOS transistor is electrically connected to the epitaxial layer through a contact that penetrates through the silicon layer, the trench isolation in the silicon layer, and the silicon oxide layer.

2. The single photon avalanche diode according to claim 1, wherein the epitaxial layer comprises silicon germanium, a group III-V material, silicon carbide, or a combination thereof.

3. The single photon avalanche diode according to claim 1, wherein the epitaxial layer comprises an N$^+$ silicon epitaxial layer, an intrinsic silicon epitaxial layer on the N$^+$ silicon epitaxial layer, a P doped silicon epitaxial layer on the intrinsic silicon epitaxial layer, an intrinsic germanium epitaxial layer on the P doped silicon epitaxial layer, and a P$^+$ germanium epitaxial layer on the intrinsic germanium epitaxial layer.

4. The single photon avalanche diode according to claim 1, wherein the epitaxial layer is disposed within a trench in a top surface of the base substrate.

5. The single photon avalanche diode according to claim 4, wherein the trench has a trench depth of about 2~3 micrometers.

6. The single photon avalanche diode according to claim 1, wherein the epitaxial layer is in direct contact with the buried oxide layer.

7. The single photon avalanche diode according to claim 1 further comprising:
    an anti-reflection layer disposed on a bottom surface of the base substrate.

8. The single photon avalanche diode according to claim 7 further comprising:
    a color filter layer disposed on the anti-reflection layer.

9. The single photon avalanche diode according to claim 8 further comprising:
    a microlens layer disposed on color filter layer.

* * * * *